(12) United States Patent
Hong

(10) Patent No.: US 7,835,216 B2
(45) Date of Patent: Nov. 16, 2010

(54) SEMICONDUCTOR MEMORY APPARATUS HAVING DECREASED LEAKAGE CURRENT

(75) Inventor: Yun Seok Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 64 days.

(21) Appl. No.: 12/407,326

(22) Filed: Mar. 19, 2009

(65) Prior Publication Data

US 2010/0118638 A1    May 13, 2010

(30) Foreign Application Priority Data

Nov. 12, 2008    (KR)    ...................... 10-2008-0112321

(51) Int. Cl.
*G11C 5/14* (2006.01)
(52) U.S. Cl. .............. 365/226; 365/189.09; 365/230.06
(58) Field of Classification Search ................. 365/226, 365/189.09, 230.06, 222
See application file for complete search history.

(56) References Cited

U.S. PATENT DOCUMENTS

| 5,801,585 | A | 9/1998 | Roohparvar |
| 7,447,084 | B2 | 11/2008 | Heo et al. |
| 7,656,720 | B2 * | 2/2010 | Ito et al. ................. 365/189.09 |
| 7,672,184 | B2 * | 3/2010 | Im et al. ..................... 365/222 |
| 2008/0273413 | A1 * | 11/2008 | Horiguchi et al. ........... 365/226 |
| 2010/0135065 | A1 * | 6/2010 | Ito et al. ..................... 365/149 |

FOREIGN PATENT DOCUMENTS

| KR | 1020060123985 A | 12/2006 |
| KR | 10-0700331 B1 | 3/2007 |

* cited by examiner

*Primary Examiner*—Gene N. Auduong
(74) *Attorney, Agent, or Firm*—Ladas & Parry LLP

(57) ABSTRACT

A semiconductor memory apparatus includes a MOS transistor configured to be supplied with a first voltage through a bulk terminal thereof. The semiconductor memory apparatus also includes a current control unit configured to be connected to a source terminal of the MOS transistor, receive a power down mode enable signal and a self refresh mode enable signal, apply a second voltage to the source terminal during a power down mode or a self refresh mode, and apply the first voltage to the source terminal during modes other than the power down mode and the self refresh mode.

12 Claims, 3 Drawing Sheets

SEMICONDUCTOR MEMORY APPARATUS HAVING DECREASED LEAKAGE CURRENT

CROSS-REFERENCES TO RELATED PATENT APPLICATION

The present application claims priority under 35 U.S.C 119(a) to Korean Application No. 10-2008-0112321, filed on Nov. 12, 2008, in the Korean Intellectual Property Office, which is incorporated herein by reference in its entirety as set forth in full.

BACKGROUND

The present invention relates generally to a semiconductor memory device, and more particularly to a semiconductor memory apparatus that can decrease a leakage current during a power down mode or a self refresh mode of the semiconductor memory apparatus.

A current design trend in the semiconductor memory device field is device miniaturization and high integration of the device. As the high integration and miniaturization of semiconductor memory elements progress, gate line widths of transistors have decreased and a threshold voltages has been lowered. As a result, current consumption has increased due to an off leakage current of the transistors.

Generally, a semiconductor memory apparatus includes a core area, where memory banks are located, for storing data, and a peripheral area, where one or more circuits are located, in order to have access to the core area. A leakage current is generated in turned-off transistors (transistors in the peripheral area) during a power down mode and a self refresh mode of the semiconductor memory device, the leakage current is an important factor that must be considered in the semiconductor device design in order to decrease the overall current consumption.

Accordingly, at the present time, different voltages are selectively applied to the transistors in order to decrease current consumption. That is, in order to decrease current consumption, a power supply voltage VDD is applied to the transistors in the peripheral area during a normal mode, a peripheral area voltage VPERI is applied to the transistors during a power down mode, and a core voltage VCORE is applied to the transistors during a self refresh mode.

In this case, the power supply voltage VDD is provided externally (from the outside), and the peripheral area voltage VPERI, as a peripheral area driving voltage, is lower than the power supply voltage VDD. The core voltage VCORE is used in the core area and is lower than the peripheral area voltage VPERI.

FIGS. 1A and 1B are diagrams showing a voltage supply state per node of a MOS transistor located in a peripheral area in a general semiconductor memory apparatus.

FIG. 1A shows a PMOS transistor P11. In this case, a peripheral area voltage VPERI is applied to a source terminal and a bulk terminal. FIG. 1B shows an NMOS transistor N11 that is connected to a specific node B. In this case, a ground voltage VSS is applied to a source terminal and a bulk terminal.

As such, at the present time, the same voltage is applied to the source terminal and the bulk terminal of the MOS transistor P11, N11. However, as an operation voltage of the semiconductor memory apparatus decreases and operation speed thereof improves, a margin of the threshold voltage of a transistor decreases.

Accordingly, even though the peripheral area voltage VPERI, or the core voltage VCORE that is lower than the power supply voltage VDD, is used during the power down mode or the self refresh mode of the semiconductor memory apparatus, the leakage current is still generated in the transistor while in an off state. As a result, it is difficult to decrease the current consumption of the semiconductor memory apparatus.

SUMMARY

A semiconductor memory apparatus capable of decreasing an off leakage current by applying a voltage having a lower level than a voltage applied to a source terminal to a bulk terminal of an NMOS transistor during a power down mode or a self refresh mode is disclosed herein.

A semiconductor memory apparatus capable of increasing an on current by applying the same voltage to a bulk terminal and a source terminal of an NMOS transistor during a normal mode is disclosed herein.

In one aspect, a semiconductor memory apparatus includes a MOS transistor configured to be supplied with a first voltage through a bulk terminal; and a current control unit configured to be connected to a source terminal of the MOS transistor, and receive a power down mode enable signal and a self refresh mode enable signal, apply a second voltage to the source terminal during a power down mode or a self refresh mode, and apply the first voltage to the source terminal during modes other than the power down mode and the self refresh mode.

According to one aspect, a standby current characteristic of a semiconductor memory apparatus can be improved by decreasing an off leakage current of a MOS transistor during a power down mode or a self refresh mode.

Further, since a driving capability of an NMOS transistor can be improved during a normal mode, operation speed of the semiconductor memory apparatus can be improved.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Hereinafter, the preferred embodiment of the invention will be described in detail with reference to the accompanying drawings.

Figure 2:
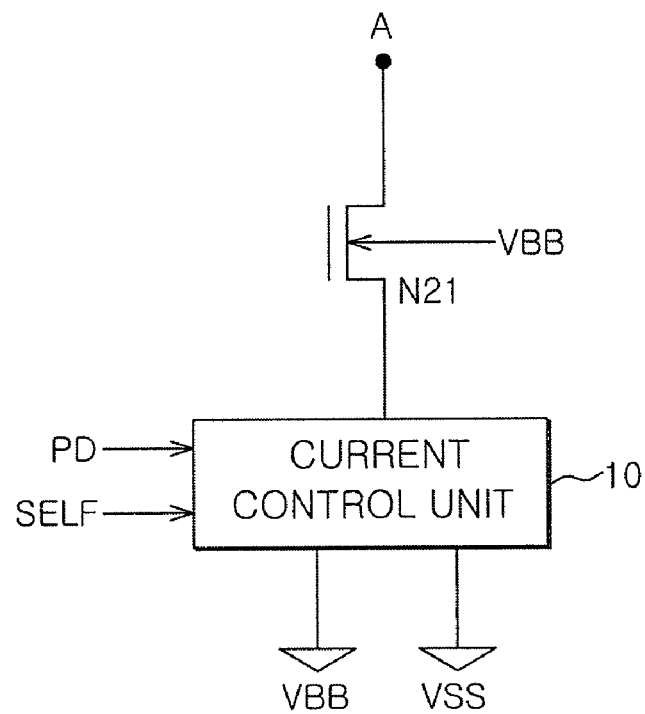
FIG. 2 is a structural diagram of an exemplary semiconductor memory apparatus according to an embodiment of the present invention.

FIG. 2 is a structural diagram of an exemplary semiconductor memory apparatus according to one embodiment.

As shown in FIG. 2, a semiconductor memory apparatus according to an embodiment of the present invention can be configured to include a current control unit 10 and a MOS transistor N21 having a bulk terminal thereof supplied with a first voltage, for example, a board bias voltage VBB.

The board bias voltage VBB can be applied to a well, or a board, of a semiconductor memory element so as to maintain a bonding surface between the well, or the board, and a circuit unit at a reverse bias state, thereby preventing an erroneous operation from occurring in the semiconductor memory apparatus. According to an embodiment of the present invention, the board bias voltage VBB is applied to the bulk terminal of the MOS transistor N21. While the board bias voltage VBB is applied to the bulk terminal of the MOS transistor N21, it should be understood that the application of the board bias voltage VBB as illustrated in FIG. 2 is only exemplary. According to an embodiment of the present invention, it is possible to apply voltages to the bulk terminal that are lower than a ground voltage VSS.

The current control unit 10 may be connected to a source terminal of the MOS transistor N21, receive a power down mode enable signal PD and a self refresh mode enable signal SELF, and apply a first voltage to the source terminal of the MOS transistor N21 during a normal mode and a second voltage, for example, the ground voltage VSS to the source terminal of the MOS transistor N21 during a power down mode or a self refresh mode.

In this case, the MOS transistor N21 can be an NMOS transistor, although it should be understood that other configurations are possible in accordance with the present invention.

Figure 1A:
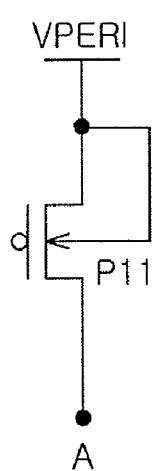
FIGS. 1A and 1B are diagrams showing a voltage supply state per node of a MOS transistor in a general semiconductor memory apparatus.
Figure 1B:
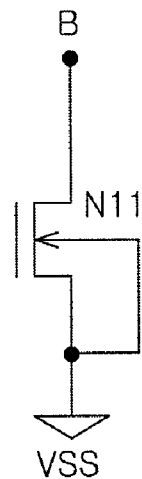
Figure 3:
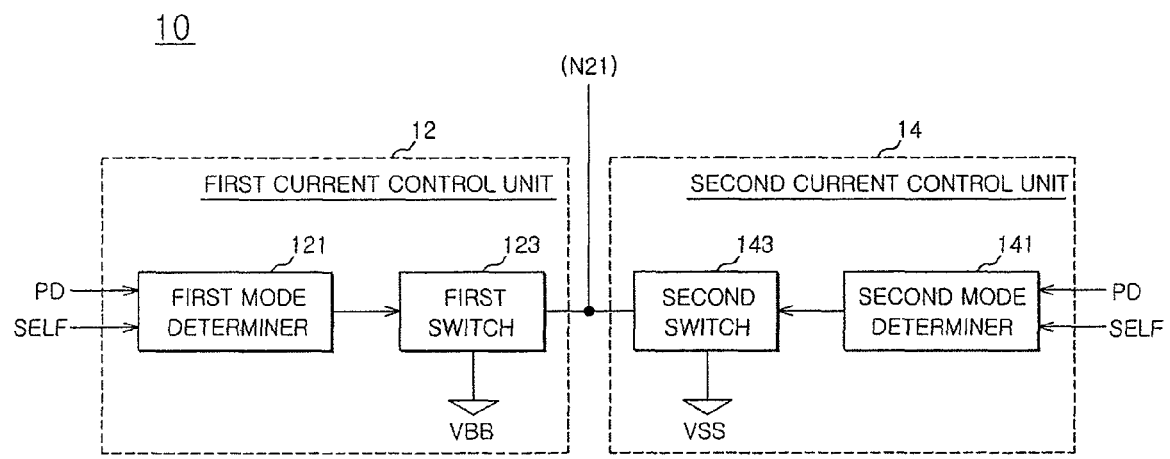
FIG. 3 is a structural diagram of an exemplary current control unit that can be included with the apparatus of FIG. 1 according to an embodiment of the present invention.

FIG. 3 is a structural diagram of an exemplary current control unit that can be included with the apparatus of FIG. 1 according to an embodiment of the present invention.

Referring to FIG. 3, the current control unit 10 may be configured to include a first current control unit 12 that is connected between the source terminal of the MOS transistor N21 and the board bias terminal VBB and a second current control unit 14 that is connected between the source terminal of the MOS transistor N21 and the ground terminal VSS.

Specifically, the first current control unit 12 can apply the board bias voltage VBB to the source terminal of the MOS transistor N21 when the device is operating in the normal mode.

In order to implement the above functions, the first current control unit 12 can be configured to include a first mode determiner 121 that receives the power down mode enable signal PD and the self refresh mode enable signal SELF and determines an operational mode of the semiconductor memory apparatus, and a first switch 123 that is connected between the source terminal of the MOS transistor N21 and the board bias terminal VBB and driven in accordance with an output signal from the first mode determiner 121.

Here, the first switch 123 can be turned on during an operational mode (for example, the normal mode) in which both the power down mode enable signal PD and the self refresh mode enable signal SELF are disabled, and the first switch 123 can then supply the board bias voltage VBB to the source terminal of the MOS transistor N21.

Additionally, the second current control unit 14 can apply the ground voltage VSS to the source terminal of the MOS transistor N21 during the power down mode or the self refresh mode.

In order to implement the above functions, the second current control unit 14 can be configured to include a second mode determiner 141 that receives the power down mode enable signal PD and the self refresh mode enable signal SELF and determines an operational mode of the semiconductor memory apparatus, and a second switch 143 that is connected between the source terminal of the MOS transistor N21 and the ground terminal VSS, the second switch 143 being driven in accordance with an output signal from the second mode determiner 141.

Here, the second switch 143 can be turned on, or enabled, when at least one of the power down mode enable signal PD and the self refresh mode enable signal SELF is enabled, that is, during the power down mode or the self refresh mode, and supply the ground voltage VSS to the source terminal of the MOS transistor N21.

Figure 4:
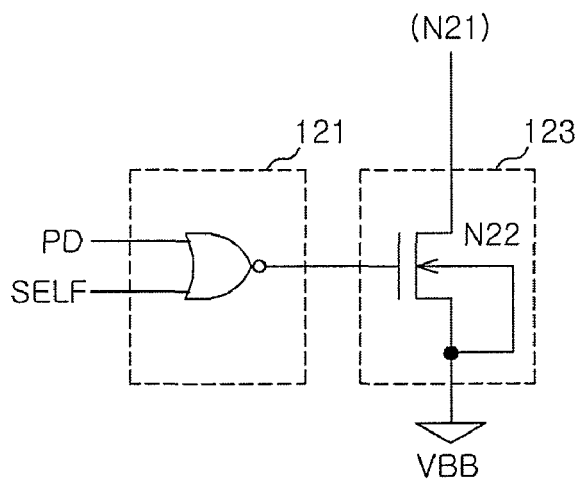
FIG. 4 is a circuit diagram of an exemplary first current control unit that can be included with the apparatus of FIG. 1 according to an embodiment of the present invention.

FIG. 4 is a circuit diagram of an exemplary first current control unit that can be included with the apparatus of FIG. 1 according to an embodiment of the present invention.

According to an embodiment of the present invention, the first mode determiner 121 can be configured to include a logical element that outputs a high-level signal when both the power down mode enable signal PD and the self refresh mode enable signal SELF are disabled. The first switch 123 can be configured to include a first MOS transistor N22 that is connected between the source terminal of the MOS transistor N21 and the board bias terminal VBB and driven in accordance with an output signal from the first mode determiner 121. Here, by way of example, the first MOS transistor N22 can be an NMOS transistor and the board bias voltage VBB can be applied to the bulk terminal thereof.

Figure 5:
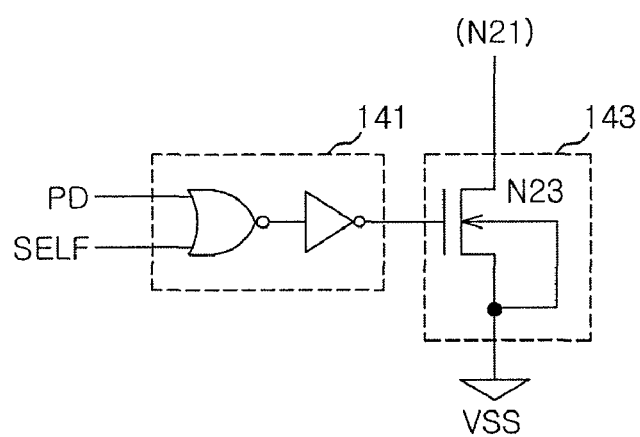
FIG. 5 is a circuit diagram of an exemplary second current control unit that can be included with the apparatus of FIG. 1 according to an embodiment of the present invention.

FIG. 5 is a circuit diagram of an exemplary second current control unit that can be included with the apparatus of FIG. 1 according to an embodiment of the present invention.

According to an embodiment of the present invention, the second mode determiner 141 of the second current control unit 14 can be configured to include a logical element that outputs a high-level signal when at least one of the power down mode enable signal PD and the self refresh mode enable signal SELF is enabled. In addition, the second switch 143 can be configured to include a second MOS transistor N23 that is connected between the source terminal of the NMOS transistor N21 and the ground terminal VSS and driven in accordance with an output signal from the second mode determiner 141. The second MOS transistor N23 can be an NMOS transistor and the ground voltage VSS can be applied to the bulk terminal thereof.

According to an embodiment of the present invention, since the board bias voltage VBB can be applied to the source terminal of the NMOS transistor that is turned on during a normal mode an on current can be increased. Accordingly, the driving capability of the NMOS transistor can be improved, which results in improving the operation speed. At this time, it should be understood that the normal mode is an example of operational modes other than the power down mode and the self refresh mode, and the principles of the present invention can be readily applied to other modes as well.

Further, according to an embodiment of the present invention, during the power down mode or the self refresh mode the ground voltage VSS can be applied to the source terminal of the NMOS transistor and the board bias voltage VBB can be applied to the bulk terminal thereof, and as such, it is possible to reduce the amount of current that leaks through a ground terminal in an off state.

The method of controlling voltage that is applied to the bulk terminal and the source terminal during the power down mode or the self refresh mode with respect to the NMOS transistor provided in a peripheral area of the semiconductor memory apparatus has been described.

Further, it is possible to control voltage that is applied to a bulk terminal of a PMOS transistor that is provided in the peripheral area of the semiconductor memory apparatus. With respect to the PMOS transistor that is formed in the peripheral area and is supplied with a first voltage, for example, a peripheral area voltage VPERI, through a source terminal, a second voltage, for example, a power supply voltage VDD, that is higher than the first voltage (the peripheral area voltage VPERI) can be supplied to the source terminal during the power down mode or the self refresh mode.

Through the method of controlling voltage as described above, current consumption can be reduced during the power down mode or the self refresh mode by applying different biases to the source terminal and the bulk terminal of the MOS transistor.

According to an embodiment of the present invention, it is possible to decrease an off leakage current of a MOS transistor that is supplied with the peripheral area voltage during the power down mode or the self refresh mode of the semiconductor memory apparatus while increasing an on current. Accordingly, since the size of the semiconductor memory apparatus can be decreased and the operation speed thereof can be increased, the semiconductor memory apparatus can be easily applied to a portable electronic apparatus.

While certain embodiments have been described above, it is to be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor memory apparatus, comprising:
   a MOS transistor having a bulk terminal, the MOS transistor configured to receive a first voltage through the bulk terminal thereof; and
   a current control unit configured to be connected to a source terminal of the MOS transistor and receive both a power down mode enable signal and a self refresh mode enable signal,
   wherein the current control unit is configured to apply a second voltage to the source terminal during at least one of a power down mode and a self refresh mode, and the current control unit is configured to apply the first voltage to the source terminal during modes other than the power down mode and the self refresh mode.

2. The semiconductor memory apparatus of claim 1, wherein the current control unit comprises:
   a first current control unit configured to be connected between the source terminal of the MOS transistor and a first voltage supply terminal, receive the power down mode enable signal and the self refresh mode enable signal, and apply the first voltage to the source terminal of the MOS transistor during the modes other than the power down mode and the self refresh mode; and
   a second current control unit configured to be connected between the source terminal of the MOS transistor and a second voltage supply terminal, receive the power down mode enable signal and the self refresh mode enable signal, and apply the second voltage to the source terminal during at least one of the power down mode and the self refresh mode.

3. The semiconductor memory apparatus of claim 2, wherein the first current control unit comprises:
   a first mode determiner configured to receive the power down mode enable signal and the self refresh mode enable signal and determine an operational mode of the semiconductor memory apparatus; and
   a first switch configured to be connected between the source terminal of the MOS transistor and the first voltage supply terminal and driven according to an output signal of the first mode determiner.

4. The semiconductor memory apparatus of claim 3, wherein the first mode determiner is configured to output a high-level signal when both the power down mode enable signal and the self refresh mode enable signal are disabled.

5. The semiconductor memory apparatus of claim 3, wherein the first switch is configured to be an NMOS transistor that is supplied with the first voltage through a bulk terminal thereof.

6. The semiconductor memory apparatus of claim 2, wherein the second current control unit comprises:
   a second mode determiner configured to receive the power down mode enable signal and the self refresh mode enable signal and determine an operational mode of the semiconductor memory apparatus; and
   a second switch configured to be connected between the source terminal of the MOS transistor and a second voltage supply terminal and driven according to an output signal of the second mode determiner.

7. The semiconductor memory apparatus of claim 6, wherein the second mode determiner is configured to output a high-level signal when at least one of the power down mode enable signal and the self refresh mode enable signal is enabled.

8. The semiconductor memory apparatus of claim 6, wherein the second switch is configured to be an NMOS transistor that is supplied with the second voltage through a bulk terminal thereof.

9. The semiconductor memory apparatus of claim 2, wherein the first voltage is configured to have a level lower than that of the second voltage.

10. The semiconductor memory apparatus of claim 2, wherein the first voltage is configured to be a board bias voltage.

11. The semiconductor memory apparatus of claim 2, wherein the second voltage is configured to be a ground voltage.

12. The semiconductor memory apparatus of claim 2, wherein the MOS transistor is configured to be an NMOS transistor.

* * * * *